United States Patent
Chow et al.

(10) Patent No.: US 6,169,742 B1
(45) Date of Patent: Jan. 2, 2001

(54) MULTIPORT DATA NETWORK SWITCH HAVING DIRECT MEDIA ACCESS CONTROL LINK TO EXTERNAL MANAGEMENT

(75) Inventors: Peter Ka-Fai Chow; Thomas J. Runaldue, both of San Jose, CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 08/992,923

(22) Filed: Dec. 18, 1997

Related U.S. Application Data

(60) Provisional application No. 60/038,025, filed on Feb. 14, 1997.

(51) Int. Cl.[7] .................................................. H04L 12/56
(52) U.S. Cl. ............................................................... 370/402
(58) Field of Search ..................................... 370/401–405, 370/465, 466, 467

(56) References Cited

U.S. PATENT DOCUMENTS

| | | | |
|---|---|---|---|
| 5,515,376 | 5/1996 | Murthy et al. | 370/402 |
| 5,661,727 * | 8/1997 | Kermani et al. | 370/445 |
| 5,726,976 * | 3/1998 | Thompson et al. | 370/229 |
| 5,784,559 * | 7/1998 | Frazier et al. | 395/200.13 |
| 5,812,792 * | 9/1998 | Haddock et al. | 709/249 |
| 5,909,549 * | 6/1999 | Compliment et al. | 709/223 |
| 5,913,037 * | 6/1999 | Spofford et al. | 709/226 |
| 5,920,699 * | 7/1999 | Bare | 395/200.55 |
| 5,978,383 * | 11/1999 | Molle | 370/445 |

\* cited by examiner

*Primary Examiner*—Huy D. Vu
*Assistant Examiner*—Jasper Kwoh

(57) ABSTRACT

An integrated multiport switch (IMS) for a data network has a management port for direct communication with an external management agent. The switch, which is integrated into a single chip, includes a management interface that comprises logic circuit elements. This interface acts as a virtual physical layer for both the media access controller (MAC) at the management port and the MAC at the external management agent. The latter may be located on the same circuit board as the IMS chip. PHY devices for these MACs are eliminated while the collision signal and carrier sense signal generation functions are maintained. The PHY devices are replaced by a logic interface while permitting use of the standard Simplified Network Management Protocol (SNMP) software for the interfacing operations. No modification of MAC software is required.

4 Claims, 6 Drawing Sheets

MULTIPORT DATA NETWORK SWITCH HAVING DIRECT MEDIA ACCESS CONTROL LINK TO EXTERNAL MANAGEMENT

RELATED APPLICATIONS

This application claims priority from provisional patent application Ser. No. 60/038,025, filed Feb. 14, 1997, the entire disclosure of which is hereby incorporated by reference herein.

TECHNICAL FIELD

The present invention relates to a data network switch and, more particularly, to media access control layer communication between the switch and an external management agent.

BACKGROUND ART

A multiport data network switch conventionally permits data communication among a plurality of media stations in a local area network. Each station in the network is associated with a port of the switch. Data frames, or packets, are transferred between stations by means of data network switch media access control (MAC) circuitry, or "engines," for each switch port. The network switch passes data frames received from a transmitting station to a destination station based on the header information in the received data frame. The switch can link the network to other networks through a router connected to one or more switch ports.

Media access typically is controlled by the respective MAC in accordance with the Simplified Network Management Protocol (SNMP) standard. Physical (PHY) layer devices are coupled between the switch port MACs and the network media. These devices include conventional analog transceivers and the like supporting circuitry. The network stations similarly are equipped with media access control (MAC) engines that are coupled to the network media through PHY devices. The MAC circuitry for each switch port must resolve contentions for traffic communication and data collisions among network stations. Data transmission collisions are possible where stations operate in half-duplex mode. The ISO 8802 (IEEE/ANSI 802.3) Standard specifies a carrier-sense multiple access with collision detection (CSMA/CD) interface to listen for traffic on the media.

Collision is detected by the physical (PHY) layer devices, which generate collision signals to be reported to the MAC engines. This functionality can be performed both at the network station end and at the switch ports. Detection of collision will cause the transmission of data to be re-scheduled to a time determined by a random backoff algorithm specified by the ISO Standard. Thus, at the end of enforcing a collision, the CSMA/CD sublayer delays before attempting to re-transmit the frame.

Typically, a standard seven wire inverted serial interface is provided between a MAC engine and the PHY devices. FIG. 1 is a block diagram of a basic two station network, depicting the interface between the MAC and PHY at each station. The TXC line is a free running clock signal provided by the MAC to strobe out serial NRZ (Non-Return to Zero) transmit data. The TXE line indicates valid transmit data from the MAC and frames an entire packet. The TXD line transmits serial NRZ data from the MAC. The data is sampled on the rising edge of the transmit clock pulses. RXD line carries serial NRZ data sent to the MAC. The RXC line carries a clock signal to which the serial NRZ receive data is synchronized. The CRS line is a carrier sense line that, in half-duplex mode, indicates valid data on the RXD line; in full-duplex mode, the CRS line indicates valid receive data and frames the entire packet. The COL line indicates detection of a collision condition by the PHY device.

Collision is detected by monitoring the data line by the PHY devices. The NRZ format is a binary encoding scheme in which ones and zeroes are represented by opposite and alternating high and low voltages and where there is no return to zero. The simultaneous application of opposite voltages to a half-duplex data line will yield a zero voltage, indicative of a collision. The PHY device then generates a collision signal, output to the MAC on the COL line. The above described interface between MAC engine and PHY device is typically present at each station network media coupling, as well as at each switch data communication port.

As data networks become more robust, the demand grows for a greater number of switch ports and the capacity to handle the increase in network stations and density of data traffic. The resulting operational complexities impose challenges to the design of semiconductor hardware. With expanding switch functionalities, the need exists for an external management capability to share control of overall switch operations. Such feature would require communication between a MAC in the switch and a MAC in the external management entity. Provision of PHY devices for each of these MACs to handle transmission of data and the collision detection and signaling functionalities would complicate system architecture with considerable additional analog hardware devices.

DISCLOSURE OF THE INVENTION

The present invention addresses the above noted needs and drawbacks of current network switches in part by providing an integrated multiport switch (IMS) having a management port for direct communication with an external management agent. The switch, which is integrated into a single chip, includes a management interface that comprises logic circuit elements. This interface acts as a virtual physical layer for both the MAC at the management port and the MAC at the external management agent. The latter may be located on the same circuit board as the IMS chip. The invention thus provides the advantage of eliminating PHY devices for these MACs while maintaining the collision signal and carrier sense signal generation functions.

A further advantage of the present invention is that the PHY devices are replaced by a logic interface while permitting use of the standard SNMP software for the interfacing operations. No modification of MAC software would be required. This result is in contrast with the substantial software revision that would be required if communication between the IMS MAC and the external MAC were to take place through the PCI bus.

An additional advantage of the management port arrangement of the present invention is that dedication of a switch communication port for external MAC management control is avoided. The number of switch ports available for network communication is thus maximized.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

Reference is made to the attached drawings, wherein elements having the same reference numeral designations represent like elements throughout and wherein.

BEST MODE FOR CARRYING OUT THE INVENTION

Figure 1:
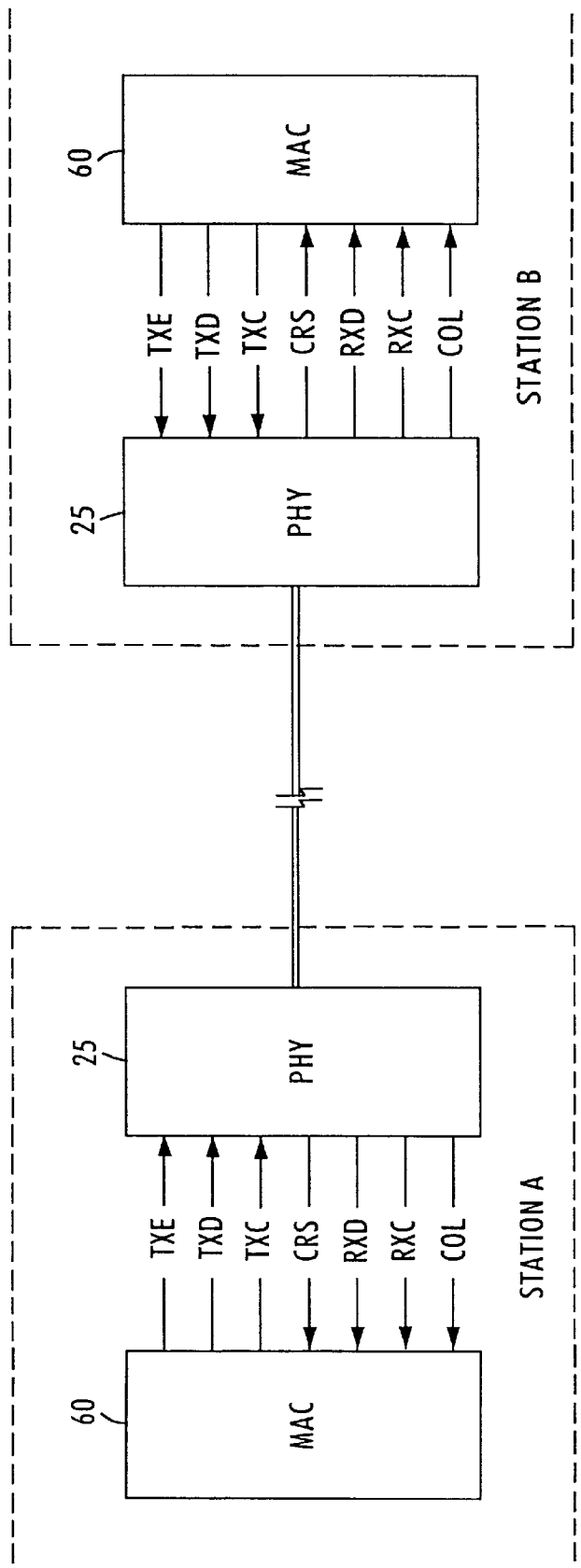
FIG. 1 is a block diagram of MAC and PHY layers of a typical prior art two station network.
Figure 2:
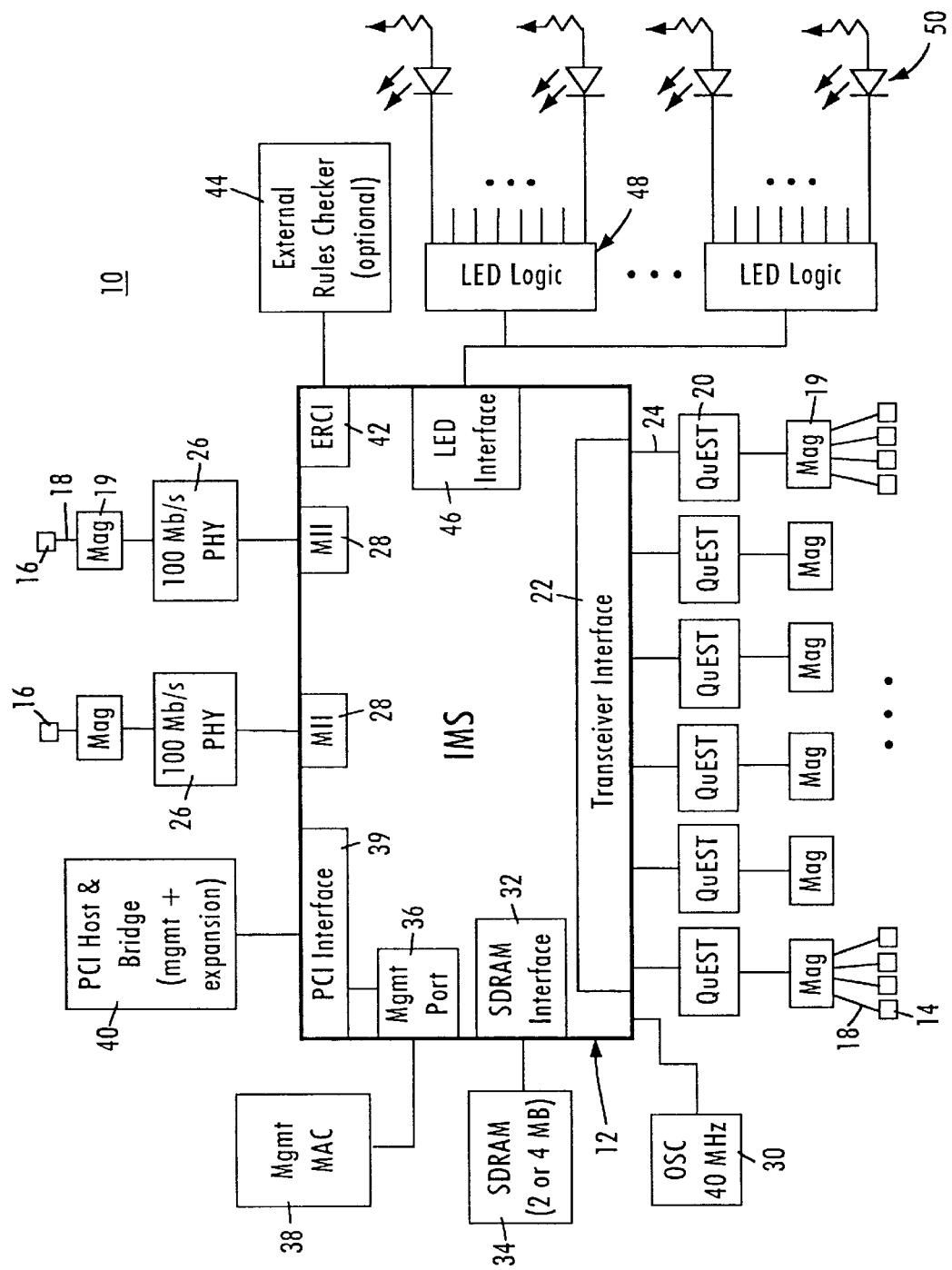
FIG. 2 is a block diagram of a packet switched system in accordance with an embodiment of the present invention.

The present invention is exemplified herein in a packet switched network environment, such as an Ethernet (IEEE 802.3) network. From the following detailed description it should be apparent that the present invention, illustrated as system 10 in the block diagram of FIG. 2, is also applicable to other packet switched systems. The packet switched network includes an integrated multiport switch (IMS) 12 that enables communication of data packets between network stations. The network stations may have different configurations. In the current example, twenty-four (24) 10 megabit per second (Mb/s) network stations 14 send and receive data at a network data rate of 10 Mb/s, and two 100 Mb/s network stations 16 send and receive data packets at a network speed of 100 Mb/s. The multiport switch 12 selectively forwards data packets received from the network stations 14 or 16 to the appropriate destination, based upon Ethernet protocol.

The 10 Mb/s network stations 14 send and receive data packets to and from the multiport switch 12 via a media 18 and according to half-duplex Ethernet protocol. The Ethernet protocol ISO/IEC 8802–3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 may include an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, so that the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 2, the network 10 includes a series of switch transceivers 20, labelled QuEST, that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. In the disclosed exemplified embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, as described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 Mhz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a PCI interface 39 enabling access by the management entity via a PCI host and bridge 40. Alternatively, the PCI host and bridge 40 may serve as an expansion bus for a plurality of IMS devices.

The multiport switch 12 includes an internal decision making engine that selectively transmits data packets received from one source to at least one destination station. In lieu of the internal decision making engine, an external rules checker may be utilized. External rules checker interface (ERCI) 42 allows use of an external rules checker 44 to make frame forwarding decisions in substitution for the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 3A:
FIG. 3 is a block diagram of a multiport switch used in the packet switched system of FIG. 2.
Figure 3A:
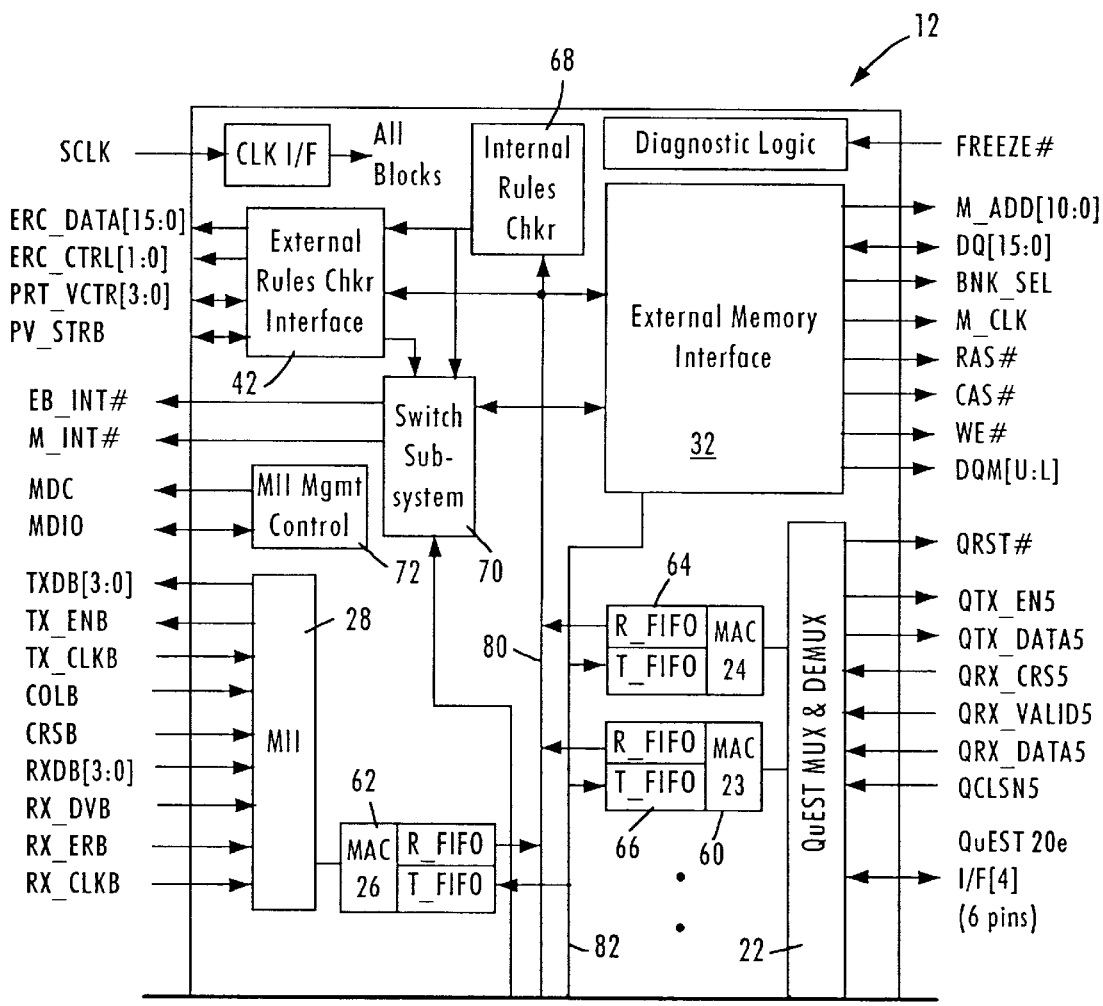
Figure 3B:
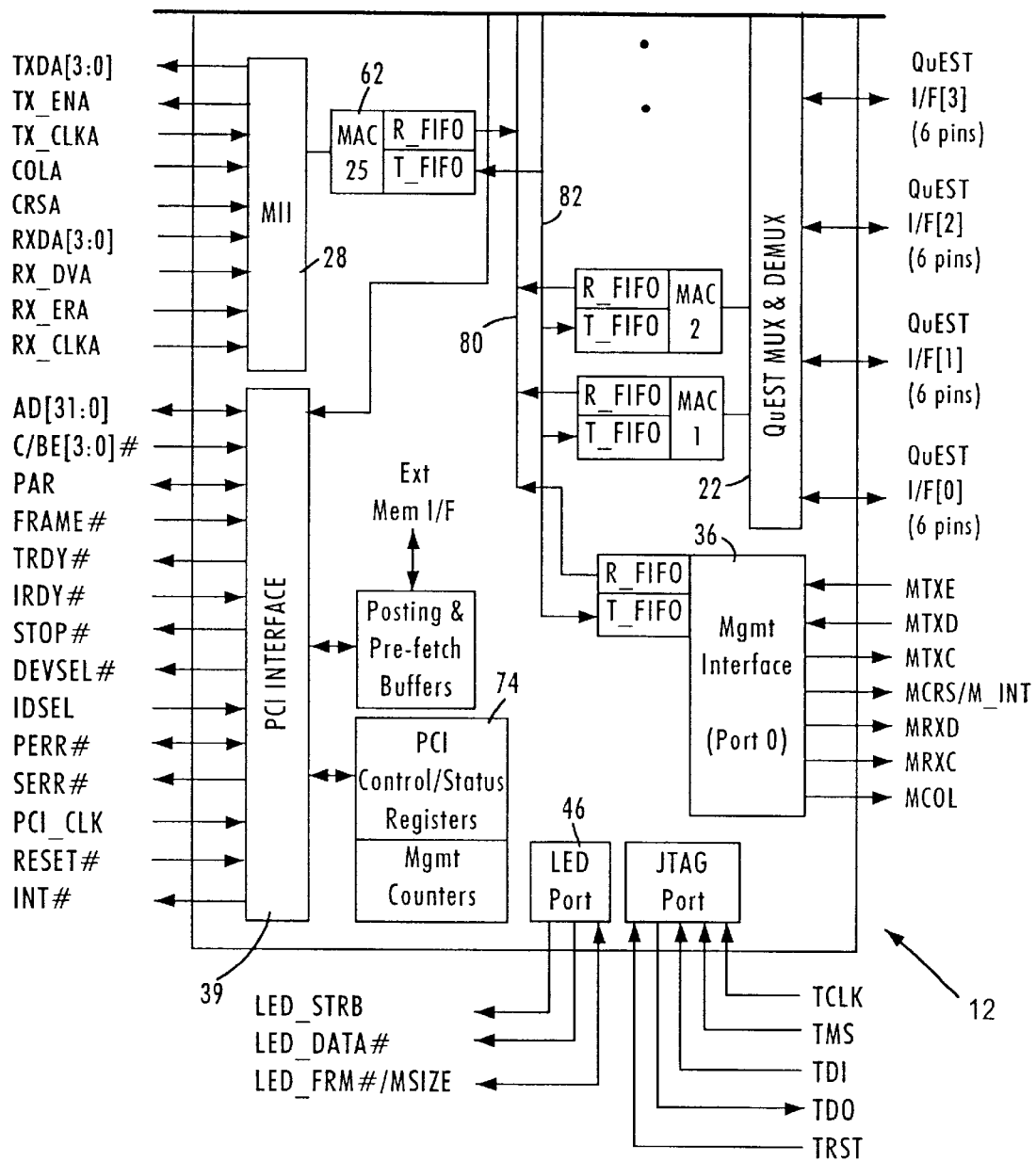

FIG. 3 is a more detailed block diagram example of the multiport switch 12 shown in FIG. 2. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first-in-first-out (FIFO) buffer 64 and transmit FIFO buffer 66. Data packets from a network station are received by the corresponding MAC port and stored in the corresponding receive FIFO buffer 64. The received data packet is output from the corresponding receive FIFO buffer 64 to the external memory interface 32 for storage in the external memory 34.

The header of the received packet is also forwarded to a decision making engine, comprising an internal rules checker 68 and an external rules checker interface 32, to determine which MAC ports will output the data packet. Whether the packet header is forwarded to internal rules checker 68 or external rules checker interface 42 is dependent on the operational configuration of multiport switch 12. Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The internal rules checker 68 and external rules checker 44 provide the decision making logic for determining the destination MAC port for a given data packet. The decision making engine may indicate that a given data packet is to be output to either a single port, multiple ports, or all ports (i.e., broadcast). Each data packet includes a header having source and destination address, in accordance with which the decision making engine can identify the appropriate output MAC port(s). The destination address may correspond to a virtual address, in which case the decision making engine identifies output ports for a plurality of network stations. Alternatively, a received data packet may include a VLAN (virtual LAN) tagged frame according to IEEE 802.1 d protocol that specifies another network (via a router at one of the 100 Mb/s stations 16) or a prescribed group of stations. Hence, the internal rules checker 68 or the external rules checker 44 via the interface 42 will decide whether a frame temporarily stored in the buffer memory 34 should be output to a single MAC port or multiple MAC ports.

The decision making engine outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information, as exemplified by the following elements. A management data interface 72 enables the multiport switch 12 to exchange control and status information with the switch transceivers 20 and the 100 Mb/s physical devices 26 according to the MII management specification (IEEE 802.3u). The management data interface 72 also outputs a management data clock (MDC) providing a timing reference on the bidirectional management data IO (MDIO) signal path. The PCI interface 39 is a 32-bit PCI revision 2.1 compliant slave interface for access by the PCI host processor 40 to internal IMS status and configuration registers 74, and access external memory SDRAM 34. The PCI interface 39 can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 4:
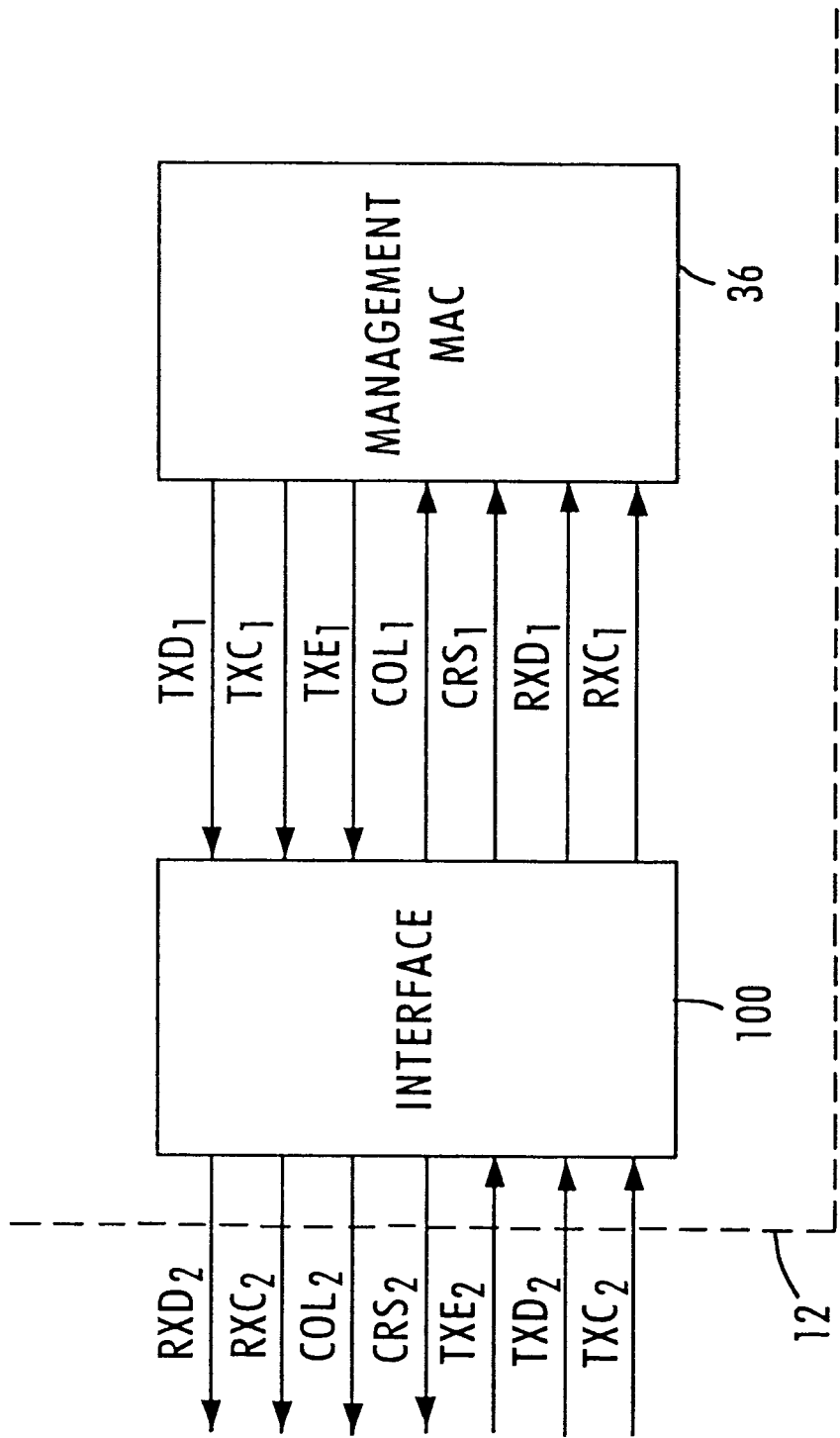
FIG. 4 is a block diagram of a management port interface in accordance with the present invention.

FIG. 4 is a block diagram of a management port interface in accordance with the present invention. The interface permits direct communication between the switch management port 36, depicted in FIGS. 2 and 3, and the external management MAC 38. This interface eliminates the need to route through the PCI interface bus. Management MAC 36 is coupled through seven signal lines to interface 100 on the IMS chip 12. Interface 100 is coupled to the external management MAC, not shown, through seven additional signal lines. The management MAC 36 outputs transmission enable ($TXE_1$), transmission data ($TXD_1$) and transmission clock ($TXC_1$,) signals to the interface 100. The management MAC receives collision ($COL_1$), carrier sense ($CRS_1$), receive data ($RXD_1$) and receive clock ($RXC_1$) signals from the interface. These transmission signals relate to the transmission of data from the IMS management MAC to the external management MAC. These receive signals relate to the receipt of data by the IMS management MAC from the external management MAC. Interface 100 outputs receive data ($RXD_2$), receive clock ($RXC_2$), collision ($COL_2$) and carrier sense ($CRS_2$) signals to the external MAC. These receive signals relate to data transmitted from the IMS management MAC and received by the interface. The interface receives transmit enable ($TXE_2$), transmit data ($TXD_2$) and transmit clock ($TXC_2$) signals from the external MAC. These transmit signals relate to relate to data transmitted from the external MAC to the IMS management MAC. The collision and carrier sense signals are generated by the interface in accordance with signals received from both MACs. As explained in more detail below with respect to FIG. 5, the interface comprises digital logic elements that perform the signal generating functions of the PHY devices. The PHY devices are thus eliminated and the interface appears as a virtual physical layer to both the IMS management MAC and the external MAC.

Figure 5:
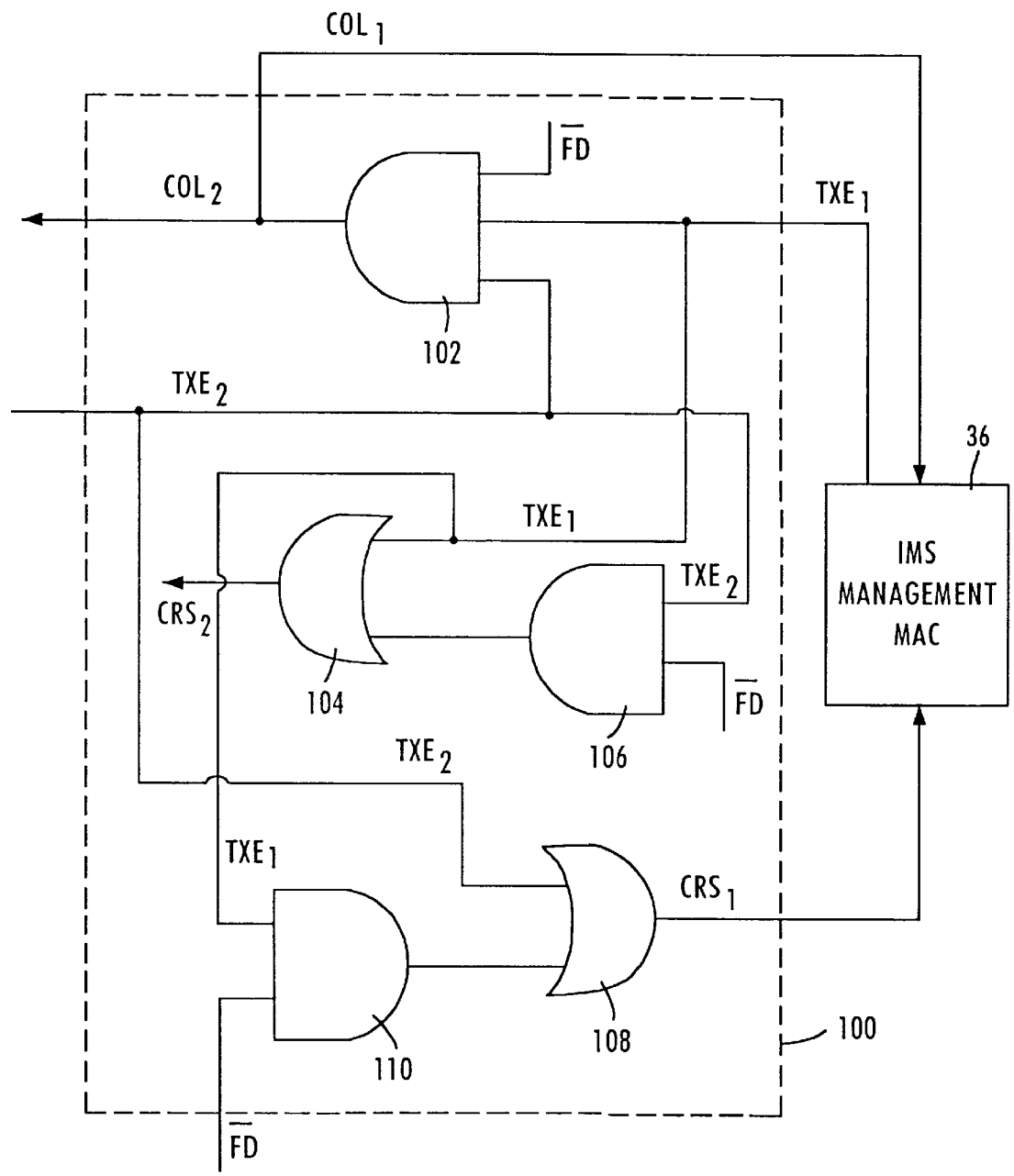
FIG. 5 is a diagram containing the logic elements of the management interface of FIG. 4.

FIG. 5 is a diagram in which the logic elements of the interface 100 are represented. These logic elements provide the functions of collision signal and carrier sense signal generation. The collisions signals $COL_1$, and $COL_2$, shown in FIG. 4, are generated by AND gate 102. Two inputs to this gate are the transmit enable signal lines $TXE_1$, and $TXE_2$, connected respectively to the IMS management MAC 36 and the external management MAC 38. A third input line $\overline{FD}$. indicates when operation is not full-duplex. As a collision condition exists only if transmission is enabled from both MACs simultaneously in half-duplex operation, the condition is sensed if all inputs to AND gate 102 are high. If so, the output is fed as $COL_1$, and $COL_2$ signals to IMS management MAC 36 and external management MAC 38.

High carrier sense signals are indicative of receipt of data in both the full-duplex mode and the half-duplex mode, and of transmission of data only in the half-duplex mode. The carrier sense signal $CRS_2$ is generated and output by OR gate 104 to the external management MAC. This gate has two inputs, including the transmit enable signal line $TXE_1$ and the output from AND gate 106. AND gate 106 has two inputs, including transmit enable signal line $TXE_2$ and the not full-duplex mode indication line $\overline{FD}$. The $CRS_2$ signal will be output whenever the $TXE_1$ line is high by virtue of the first OR gate input. The second OR gate input will be high only if the $TXE_2$ line is high and operation is not full-duplex by virtue of AND gate 106.

The carrier sense signal $CRS_1$ is generated and output by OR gate 108 to the IMS management MAC 36. This gate has two inputs, including the transmit enable signal line $TXE_2$ and the output from AND gate 110. AND gate 110 has two inputs, including the $TXE_1$ signal line and the not full-duplex mode indication line. The $CRS_1$ output from gate 108 thus will be high whenever the $TXE_2$ is high by virtue of the first input. The second or gate input will be high only in the $TXE_1$ line is high, or gate and operation is not in full-duplex, by virtue of AND gate 110.

Interface 100 provides a direct connection between the TXD, line from the IMS management MAC to the $RXD_2$ line of the external management MAC. Similarly direct connections are provided between the $TXC_1$ line of the IMS MAC and the $RXC_2$ line of the external MAC, between the $RXD_1$ line of the IMS MAC and the $TXD_2$ of the external MAC, and between the $RXC_1$ line of the IMS MAC and the $TXC_2$ of the external MAC. These connections have not been shown for simplicity of illustration.

The present invention thus provides the functionality of PHY devices between a switch port and an external management agent while eliminating such devices. Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A multiport network switch for interfacing with a data network and having a logic chip comprising:
   a plurality of ports for transmitting data packets to and receiving data packets from said data network;
   a management port for communicating data in half duplex mode and full duplex mode with a management agent external to said chip;
   a media access controller (MAC) at said management port for supporting Simplified Network Management Protocol (SNMP); and
   a digital interface coupled between said MAC and the external management agent, said digital interface being formed on said chip and comprising:
     a collision logic circuit for detection a data transmission collision condition during non-full duplex operation and outputting a collision indicating signal; and
     a carrier sense logic circuit for detecting carrier sense conditions and outputting carrier sense signals;
     wherein said carrier sense signals are indicative of receipt of data in both the full duplex mode and the half duplex mode, and of transmission of data only in the half duplex mode.

2. A multiport network switch as recited in claim 1, wherein said collision logic circuit comprises an AND gate having a first input for receiving a transmit enable signal from said MAC, a second input for receiving a transmit enable signal from said external management agent, and a third input for receiving a non full-duplex signal;
   wherein said collision indicating signal is generated by said AND gate and is applied in direct connections to the media access controller (MAC) at the management port and to the external management agent.

3. A multiport network switch as recited in claim 1, wherein said carrier sense logic circuit comprises:
   a first OR gate comprising first and second inputs and an output; and
   a first AND gate comprising first and second inputs and an output; and wherein
   said first OR gate first input is coupled for receiving a transmit enable signal from said MAC, said first OR gate second input is coupled for receiving the output of said first AND gate, and said first OR gate output is connected to a carrier sense signal line coupled to said external management agent; and
   said first AND gate first input is coupled for receiving a transmit enable signal from said external management agent, and said first AND gate second input is coupled for receiving a signal indicative of non full-duplex operation.

4. A multiport network switch as recited in claim 3, wherein said carrier sense logic circuit further comprises:
   a second OR gate comprising first and second inputs and an output; and
   a second AND gate comprising first and second inputs and an output; and wherein
   said second OR gate first input is coupled for receiving a transmit enable signal from said external management agent, said second OR gate second input is coupled for receiving the output of said second AND gate, and said second OR gate output is connected to a carrier sense signal line coupled to said MAC; and
   said second AND gate first input is coupled for receiving a transmit enable from said MAC, and said second AND gate second input is coupled for receiving a signal indicative of non full-duplex operation.

* * * * *